(12) United States Patent  
Wang et al.

(10) Patent No.: US 6,452,201 B1
(45) Date of Patent: Sep. 17, 2002

(54) WAFER-MAPPING METHOD OF WAFER LOAD PORT EQUIPMENT

(75) Inventors: Yu-Sheng Wang; Chien-Rong Huang; Kuan-Chou Chen, all of Hsinchu; Ping-Yu Hu, Hsinchu Hsien; Tzong-Ming Wu, Taipei, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 107 days.

(21) Appl. No.: 09/619,087

(22) Filed: Jul. 19, 2000

(51) Int. Cl.$^7$ ............................................... G01N 21/88
(52) U.S. Cl. .......................... 250/559.29; 250/559.33; 250/559.36; 414/936
(58) Field of Search ................... 250/559.29, 559.3, 250/559.33, 559.36, 559.37, 559.4, 221, 214 R; 414/936, 937, 938, 941; 356/614

(56) References Cited

U.S. PATENT DOCUMENTS 6,013,920 A * 1/2000 Gordon et al. ......... 250/559.36
6,053,983 A * 4/2000 Saeki et al. ................. 118/728

* cited by examiner

Primary Examiner—Kevin Pyo
(74) Attorney, Agent, or Firm—Powell, Goldstein, Frazer & Murphy, LLP

(57) ABSTRACT

This invention uses the pattern-based signal to accelerate the evaluation process as a means to replace complicated computing procedures. This invention is constructed through implementing absolute coordinates to produce pattern-based signals by position and two optical sensor signals, and through conducting the feature extraction process. This process produces feature signals of sidelong and overlapped issues. Furthermore, through transforming signals, feature signals can be handled by the digital data processor. Thus, this invention can achieve the three main objectives of wafer mapping.

8 Claims, 10 Drawing Sheets

WAFER-MAPPING METHOD OF WAFER LOAD PORT EQUIPMENT

BACKGROUND OF THE INVENTION

1. Field of the Invention

The present invention relates to an operation method of a wafer load port system, and more particularly, to a wafer mapping method of a wafer load port equipment.

2. Description of the Prior Art

Every kind of process equipment is specially designed to meet all sorts of demands in the semiconductor industry. Different parameters are set in various conditions to match process methods and to meet process requirements. Nevertheless, the demand for process stability, uniformity and accuracy is identical. Thus, in different types of process equipment, the semiconductor wafer has to be firmly fixed onto a support brace, and to be placed in a specific process chamber in order to implement every semiconductor process, and to meet the requirement of uniformity and accuracy when considering the pre-designed process parameters.

FIG. 1 shows a wafer carrier in a wafer load port equipment. In tradition, wafer load port equipment 20 is used to uphold a wafer carrier 22. Thus can the latter be opened or closed. Conventionally, wafer load port equipment 20 entails a support brace 26 in order to connect wafer carrier 22 and to move it to a fixed position of the load port equipment. Support brace 26 entails a bulkhead 24. The structure of this bulkhead is shown in FIGS. 1 and 2. Mating plate 42 is on top of the bulkhead 24, and this plate is movable. In addition, there is a latch key 54 on the movable mating plate 42. When the wafer carrier 22 leans on the bulkhead 24, the door of this carrier faces the direction of bulkhead 24, and the latch key 54 can be inserted into two holes on the door of the carrier 22. After the latch key 54 is inserted into the holes, this latch key 54 turns 90 degrees to lock the door of wafer carrier 22. Furthermore, the plate moves backward, and the wafer carrier 22 can be opened. Mating plate 42, then, moves downward until a specific position. The above procedures explain how the wafer load port equipment opens the wafer carrier. If the above procedures are conducted in reverse, the opened carrier can be closed.

There are more or less design differences between wafer carriers produced by different manufacturers. Thus, when carriers from different companies are used together, a calibration procedure is required. The load port equipment, afterwards, records the calibration value until the operation of the same procedure next time. That is, while processing calibration, the load port equipment re-records a new value. In addition, it should be noted that this procedure is not only required when using different carriers from different manufacturers, it is also required after the assemblage of the load port equipment.

In conducting the above techniques, sidelong and overlapped issues can be estimated by considering the recorded wafer position, the coordinates and the measurement of the uncertainty volume. If sidelong or overlapped issues do not occur, data acquired by conducting the above techniques can decipher the wafer position with a digital processor. However, the existence of sidelong or overlapped issues can only be determined by a complicated computing process in the above techniques. Thus, it is necessary to accelerate the estimate of these two issues in order to avoid the complicated calculation of wafer mapping developed in the past.

SUMMARY OF THE INVENTION

This invention uses the pattern-based signal to accelerate the evaluation process as a means to replace complicated computing procedures. This invention is constructed through implementing absolute coordinates to produce pattern-based signal by position and two optical sensor signals, and through conducting the feature extraction process. This process produces feature signals of sidelong and overlapped issues. Furthermore, through transforming signals, feature signals can be handled by the digital data processor. Thus, this invention can achieve the three main objectives of wafer mapping.

In summary, the advantage of the wafer-mapping method suggested by this invention is to detect the wafer position, sidelong and overlapped issues through employing the digital-signal method.

It is also the advantage of this invention to rapidly detect the wafer position, sidelong and overlapped issues at the same time.

Using two sensor and position signals in wafer mapping is another advantage of this invention.

Furthermore, this invention is beneficial in conducting the feature extract process through implementing electronic circuits to perform the feature extraction process.

It is still another advantage of this invention to use monolithic microcontroller coupled with software programs to perform the feature extraction process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Mapping between each wafer and load port equipment is very important since there is usually, 13 or 25 wafers are placed in the carrier at the present stage of the development. The position of wafers located in the wafer carrier is provided to the process machine. Poor wafer mapping, as well as sidelong and overlapped issues, would result in severe consequences of wafer processes.

In general, wafer mapping is completed by adopting the measurements of absolute coordinates and the wafer thickness. The mapping method is developed by setting up an original, mechanical point in order to record the absolute coordinates of each wafer in the carrier.

From observing the crosscut of a wafer, we know that each wafer entails two coordinates composed of the upper and lower positions. Ideally, the distance between these two is equivalent to the wafer thickness. The coordinates are acquired through the pattern-based signal by position. This signal is produced by the motor characterized by an up-and-down movement. For instance, the pulse control signal of a stepper motor or a position sensor on the driving system (either an encoder or an optical meter) can be the case here.

There are three objectives of wafer mapping: detecting the wafer position, the sidelong issue and the overlapped issue.

This invention uses the pattern-based signal to accelerate the evaluation process as a means to replace complicated computing procedures. This invention is constructed through implementing absolute coordinates to produce position-based signals by and two optical sensor signals, and through conducting the feature extraction process. This process produces feature signals of sidelong and overlapped issues. Furthermore, through transforming signals, feature signals can be handled by the digital data processor. Thus, this invention can achieve the three main objectives of wafer mapping.

Figure 4:
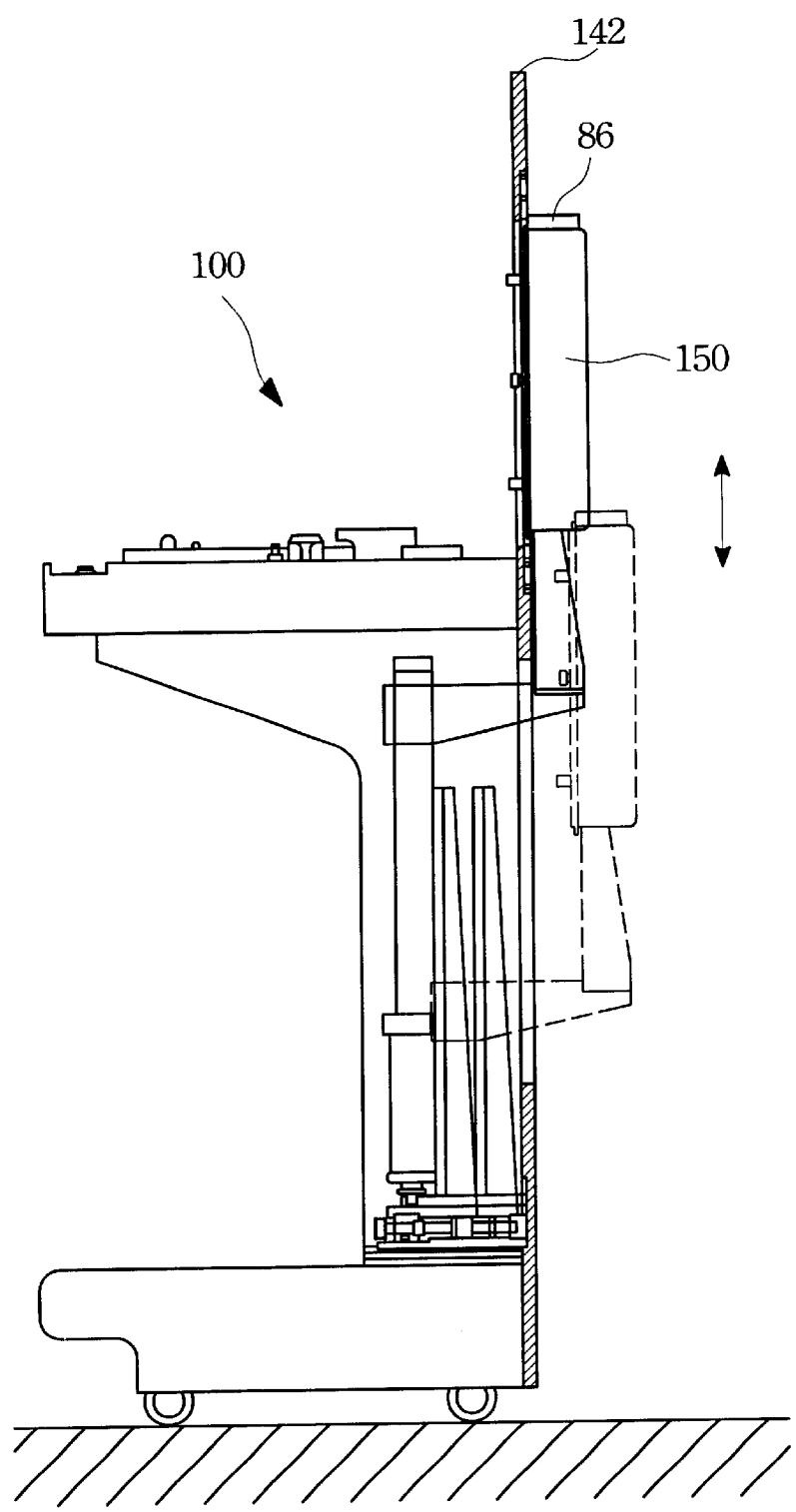
FIG. 4 is a side view of a wafer load port equipment of the present invention.

Details of the solutions provided by this invention are as follow:

This invention uses the reflective type of optical sensor system, such as, reflective type of laser sensor. The sensor structure is indicated by FIG. 4. The beam from this reflective type of optical sensor 86 reaches right at the edge of wafers 120. Thus, mapping electronic signals are produced by determining whether the beam reflects the optical sensor.

Figure 1:
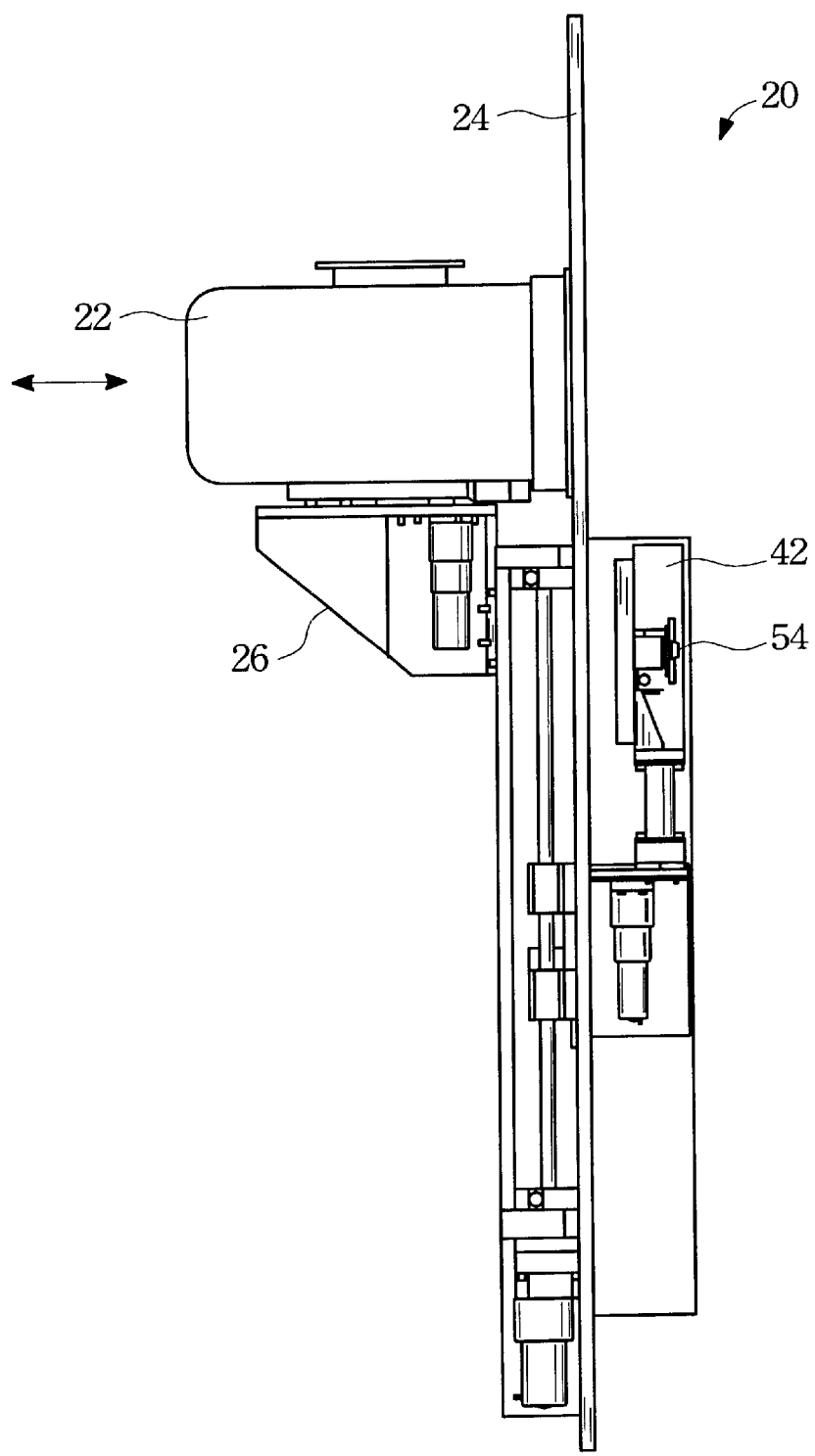
FIG. 1 is a side view of a conventional wafer load port equipment.
Figure 2:
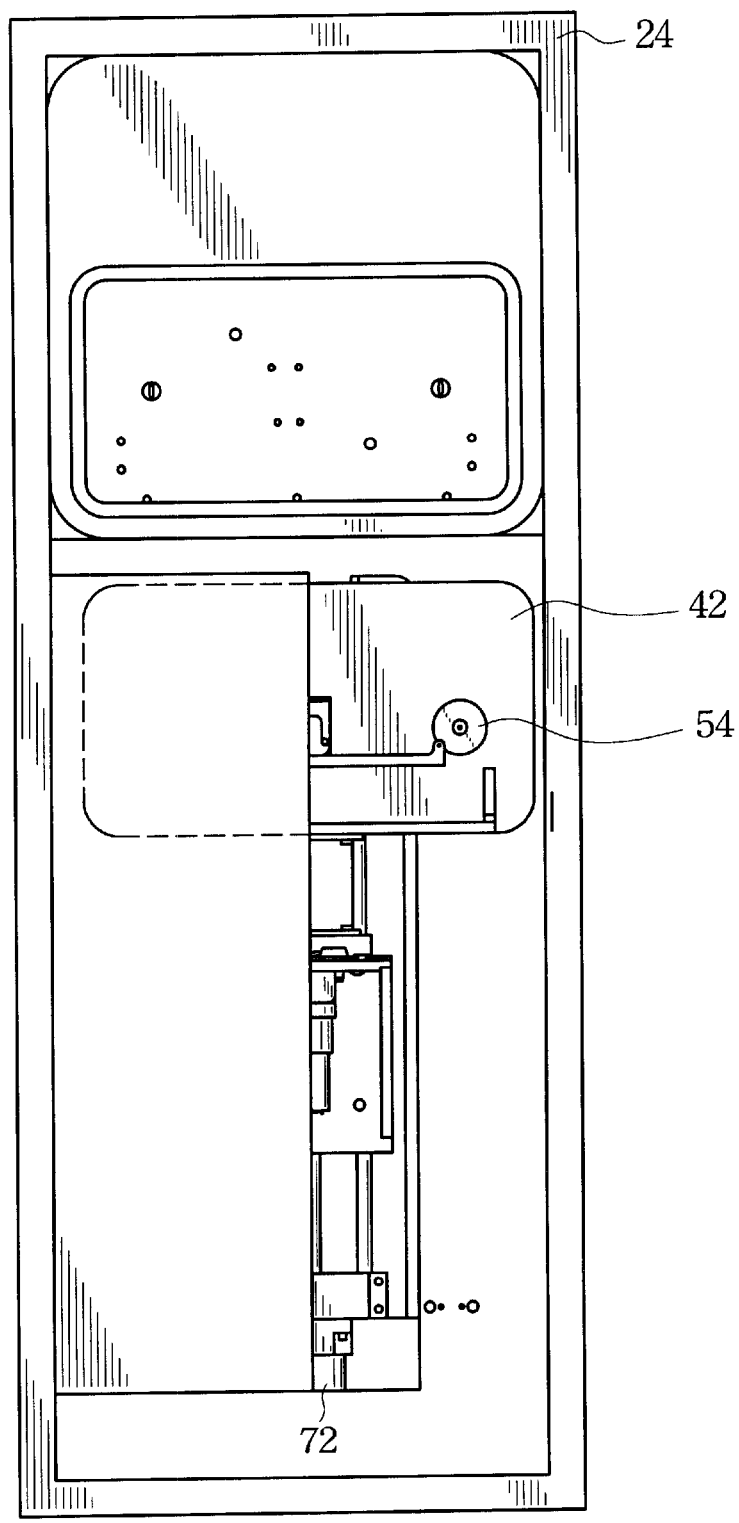
FIG. 2 is a rear view of a conventional wafer load port equipment.
Figure 3:
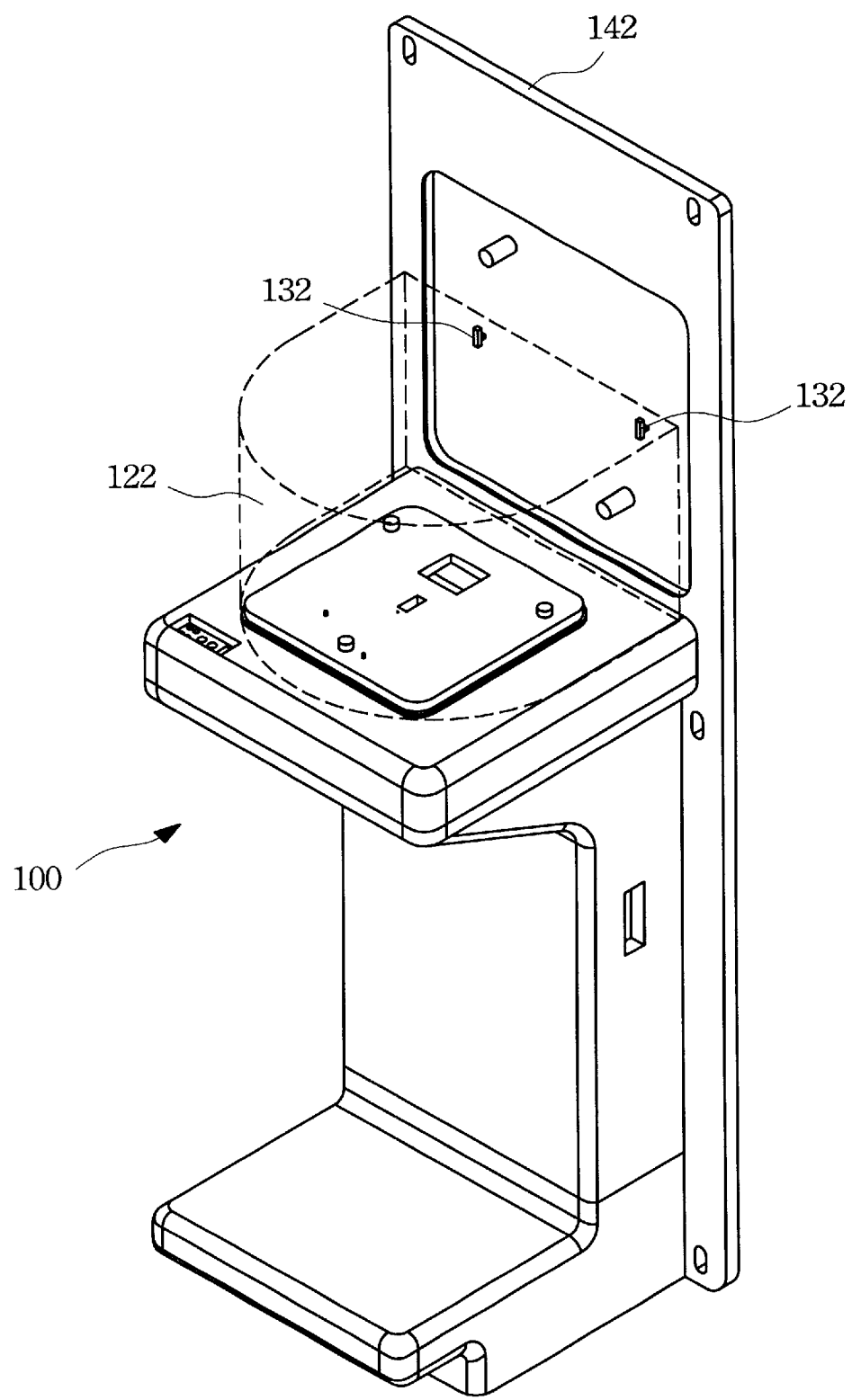
FIG. 3 is a perspective view of a wafer load port equipment of the present invention.
Figure 5:
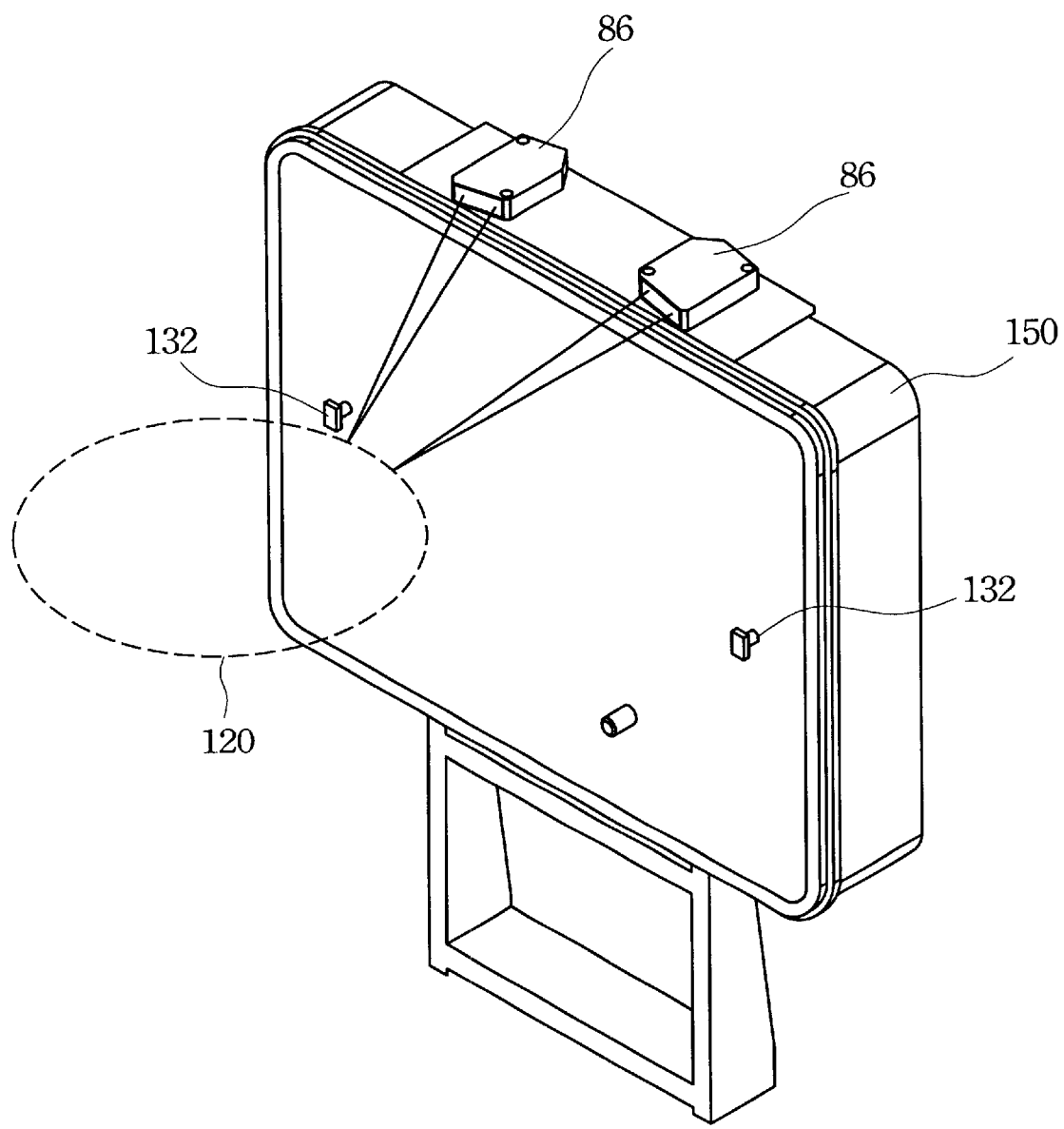
FIG. 5 is a schematic view showing an optical sensor of the present invention.

FIGS. 3 through 4 illustrates the implementation of this invention: Wafer carrier 122 is placed in wafer load port equipment 100. The door of this carrier faces the direction of bulkhead 142. For the clarity of demonstration, the wafers 120 are shown in FIG. 5. There is a mating plate 150 behind the bulkhead 142. Furthermore, there are, for example, two fixed optical sensors 86 on the mating plate. The data collecting process of wafer mapping starts, and the digital processor (not shown) enters the collected data. The digital processor can be a central processor unit. In addition, a servomotor is used to move the mating plate 150 downward.

The mapping method constructed by this invention is as follow: when the beam of the optical sensor hits reflector (not shown), when mating plate 150 moves downward, and when the beam is no longer reflected, what is at the bottom of reflector is the initial referential position. Afterwards, the absolute coordinates of a wafer in the carrier can be recorded by using index and pulse signals of the encoder (not shown). For instance, (Xi, Xp) shows (pulse count of index signal, pulse count). Each wafer records two coordinates, including a wafer's upper limited value (Xti, Xtp), and lower limited value (Xbi, Xbp). Thus, with the aid of these coordinates, the digital data processor produces mapping pattern-based signals by position. Since 13 or 25 wafers can be simultaneously placed in a normal wafer carrier, there are 13 or 25 pulse signals produced when slots are fully inserted.

When wafer carriers are placed on the support brace of a wafer carrier, the support brace moves forward and the latch key 132 on mating plate locks the door of the carrier. Furthermore, mating plate moves backward a little bit. While being ready to descend, wafer mapping is also activated. After mating plate descends to a fixed position, three types of signals are produced. Through reading these signals, three major objectives of wafer mapping can be obtained. The ways to reach these goals are discussed separately in the following section.

Figure 8:
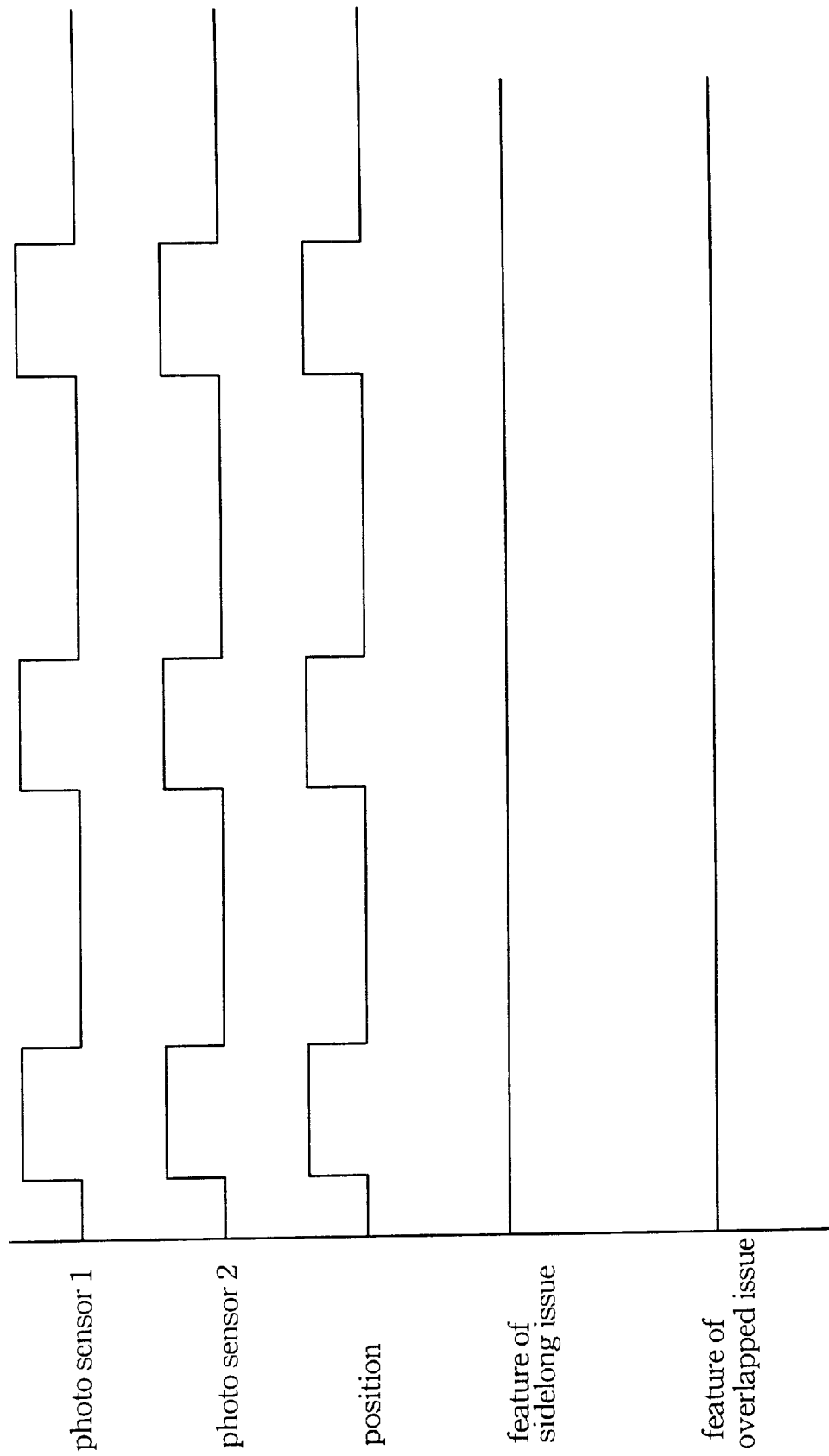
FIG. 8 is a time-based diagram of a normal situation without wafer lacking, sidelong and overlapped issues.

Regarding the wafer position:

First, when there is no occurrence of sidelong or overlapped issues, a particular wafer position in the carrier can be determined by the pattern-based signal by position and that of one of the optical sensors. FIG. 8 shows the situation when all of the slots are inserted by wafers. That is, there is no vacancy in the carrier. FIG. 8 shows the case when there are wafers in three slots. The pattern-based signal by position is produced on a regular basis. This signal comes from the motor of mating plate, and this motor moves upward and downward. For instance, they can be either pulse control signal or the positional sensor of the stepper motor. That is, every pulse signal of the pattern-based signal by position maps every slot. That is, FIG. 8 shows that three pulse signals separately map three slots. Since there are wafers in slots, the wave form and position of optical sensors 1 and 2 are identical with those of the pattern-based signal by position. In addition, when there is no sidelong or overlapped issues under a normal circumstance, features of sidelong and overlapped issues in FIG. 8 do not produce pulses.

Figure 6:
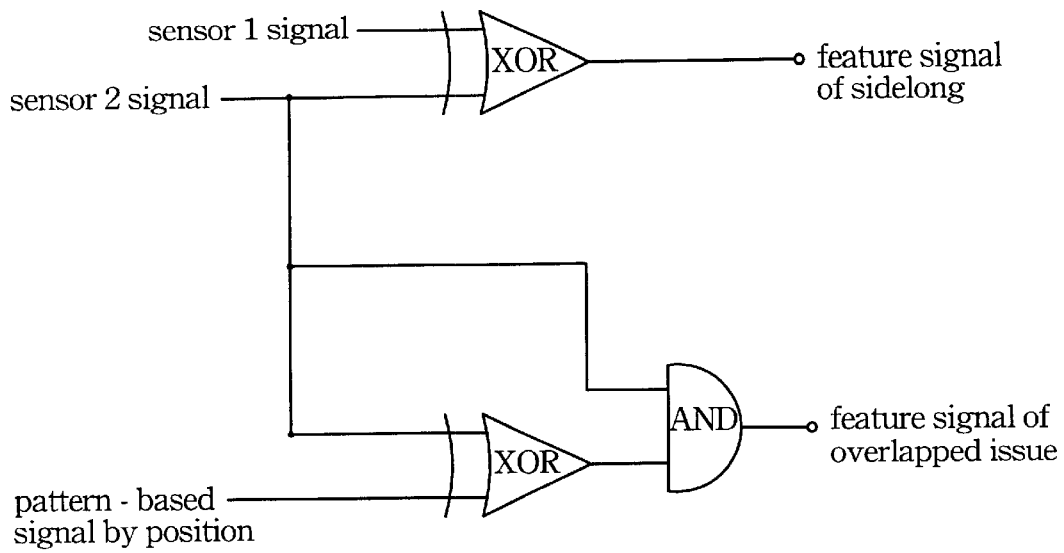
FIG. 6 is a diagram of a feature extract circuit of the present invention.
Figure 9:
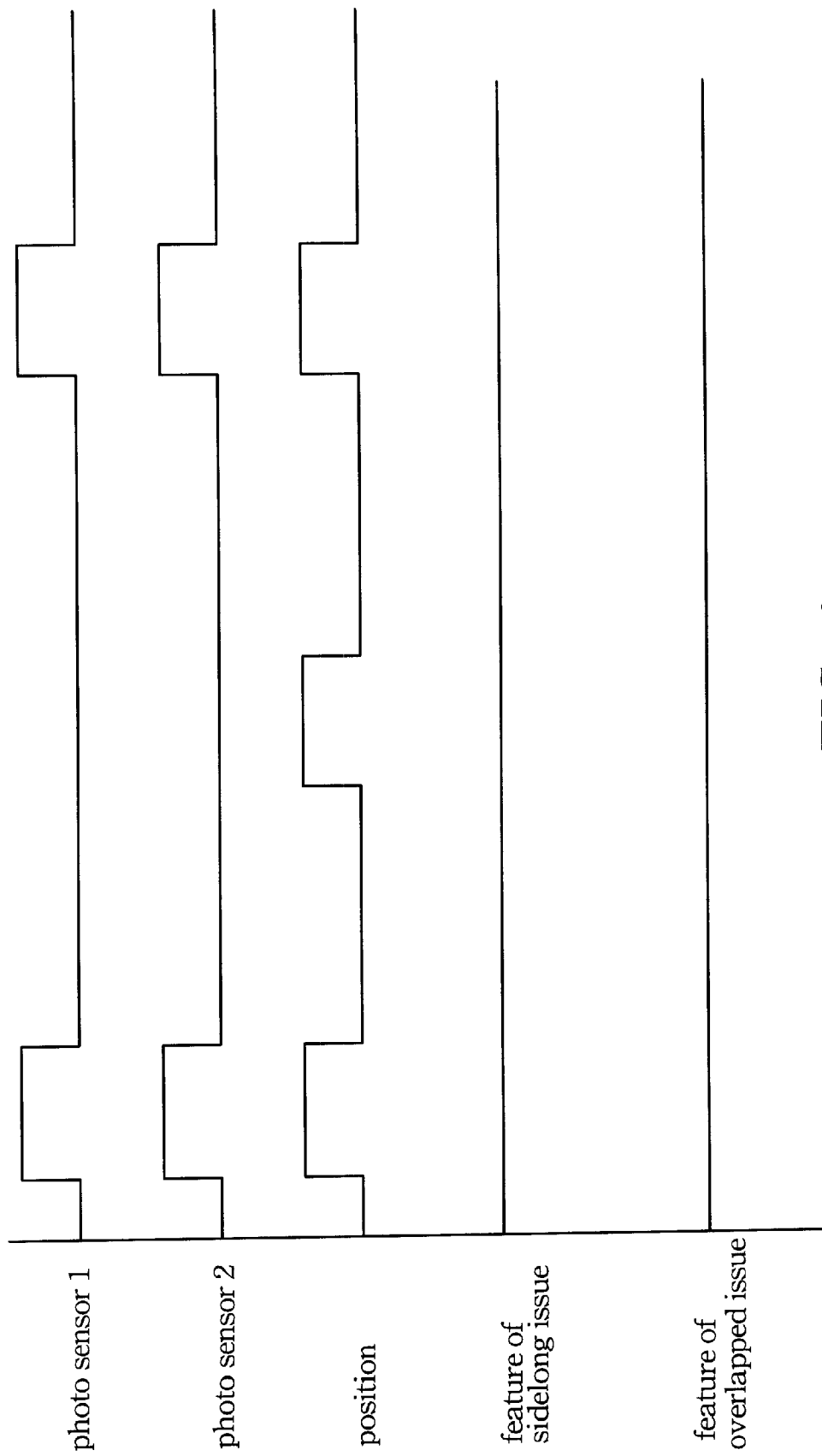
FIG. 9 is a time-based diagram of a situation having wafer lacking issue.

FIG. 9 shows the condition when there is no wafer in the carrier. Three slots are still used here. From this figure, we know that the pattern-based signal by position still regularly produce three pulses. When the second pattern-based signal by position occurs, we examine both or one of the optical sensors to determine whether there is pulse in the sensor signal. The existence of pulse indicates that there is a wafer in this slot. The absence of pulse indicates no wafer in this slot. For instance, there is no wafer in the second slot when the second pulse of the pattern-based signal by position occurs, and two optical sensors do not produce corresponding pulse signals (See FIG. 9). The sidelong or overlapped feature signal does not occur after conducting FIG. 6's feature extraction process on two optical sensor signals and pattern-based signals by position. FIG. 6 shows the circuit plot of the feature extraction.

Figure 7:
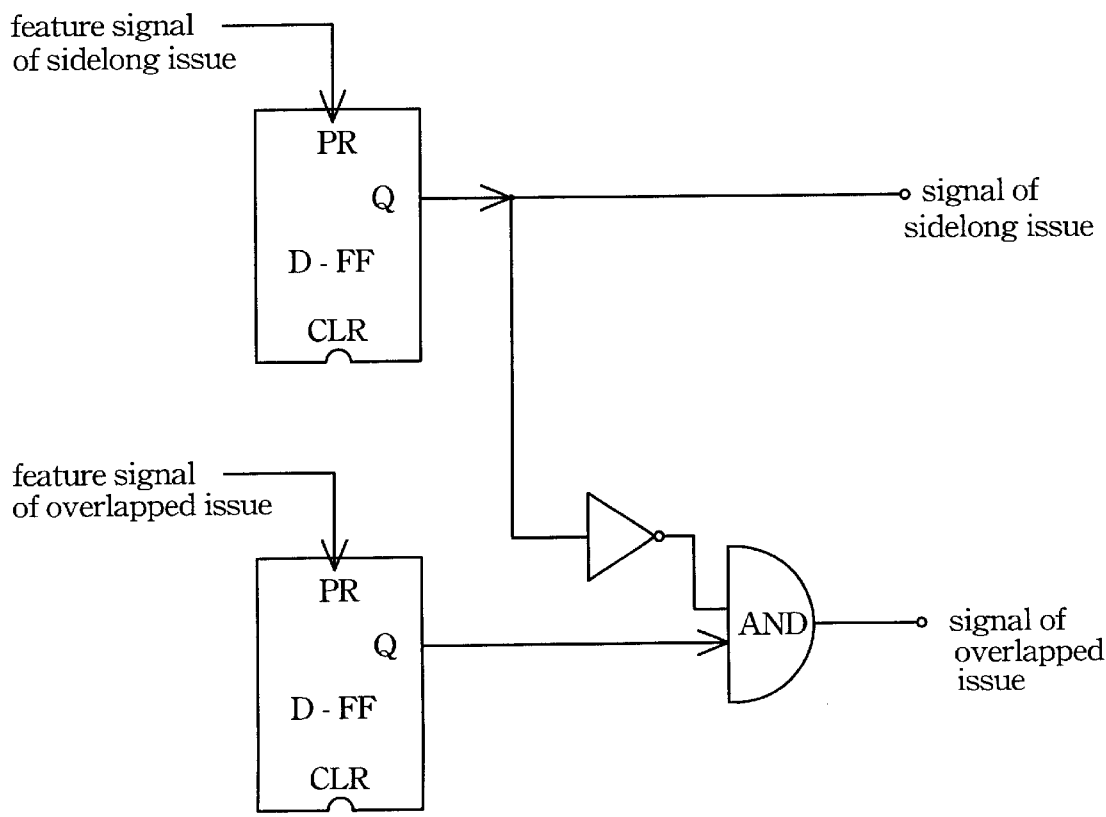
FIG. 7 is a diagram of a signal convert circuit of the present invention.

Thereafter, signals are converted by circuits shown in FIG. 7. FIG. 7 shows a signal-converting circuit of the present invention. Since both values of sidelong and overlapped signals are 0, thus, it can be estimated that there is no sidelong or overlapped issue in the first and third slots. Only the second slot is empty without a wafer. Consequently, this invention can detect whether there is wafer in the slot or not.

The detection of the sidelong issue:

When the sidelong issue occurs, the time-based diagram of three signals can be obtained. These three signals independently map wafers in three slots (please see FIG. 10). Furthermore, through the feature extraction process shown in FIG. 6, the feature signal of the sidelong issue can be received.

Figure 10:
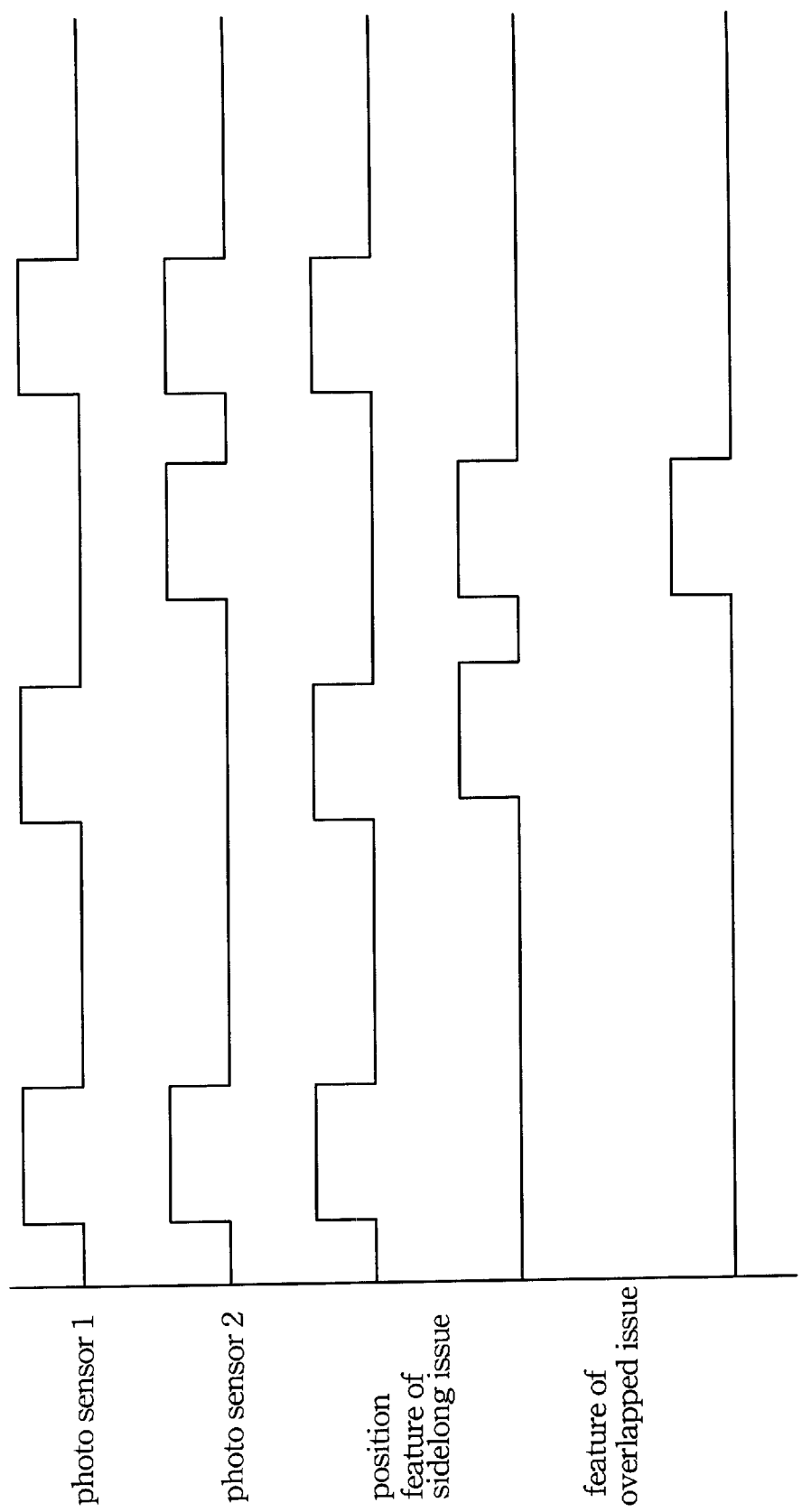
FIG. 10 is a time-based diagram of a situation having sidelong issue.

FIG. 10 illustrates the occurrence of the sidelong issue of the wafer in the second slot. This figure illustrates that, even though the pattern-based signal by position is fixed, the slanting phenomenon still occurs on the signals obtained by the optical sensors 1 and 2 in mapping the second slot. Both sidelong and overlapped feature signals occur, if signals obtained by two sensors and the pattern-based signal by position are handled by the feature extract process shown in FIG. 6.

Since only the sidelong issue occurs in the wafer on the preset second slot, the overlapped feature signal can be filtered by using signal-converting circuit in FIG. 7. Thus, the value of the sidelong signal is 1 and that of the overlapped signal is 0. This invention can detect whether there is occurrence of the sidelong issue to wafers in the slot.

Figure 11:
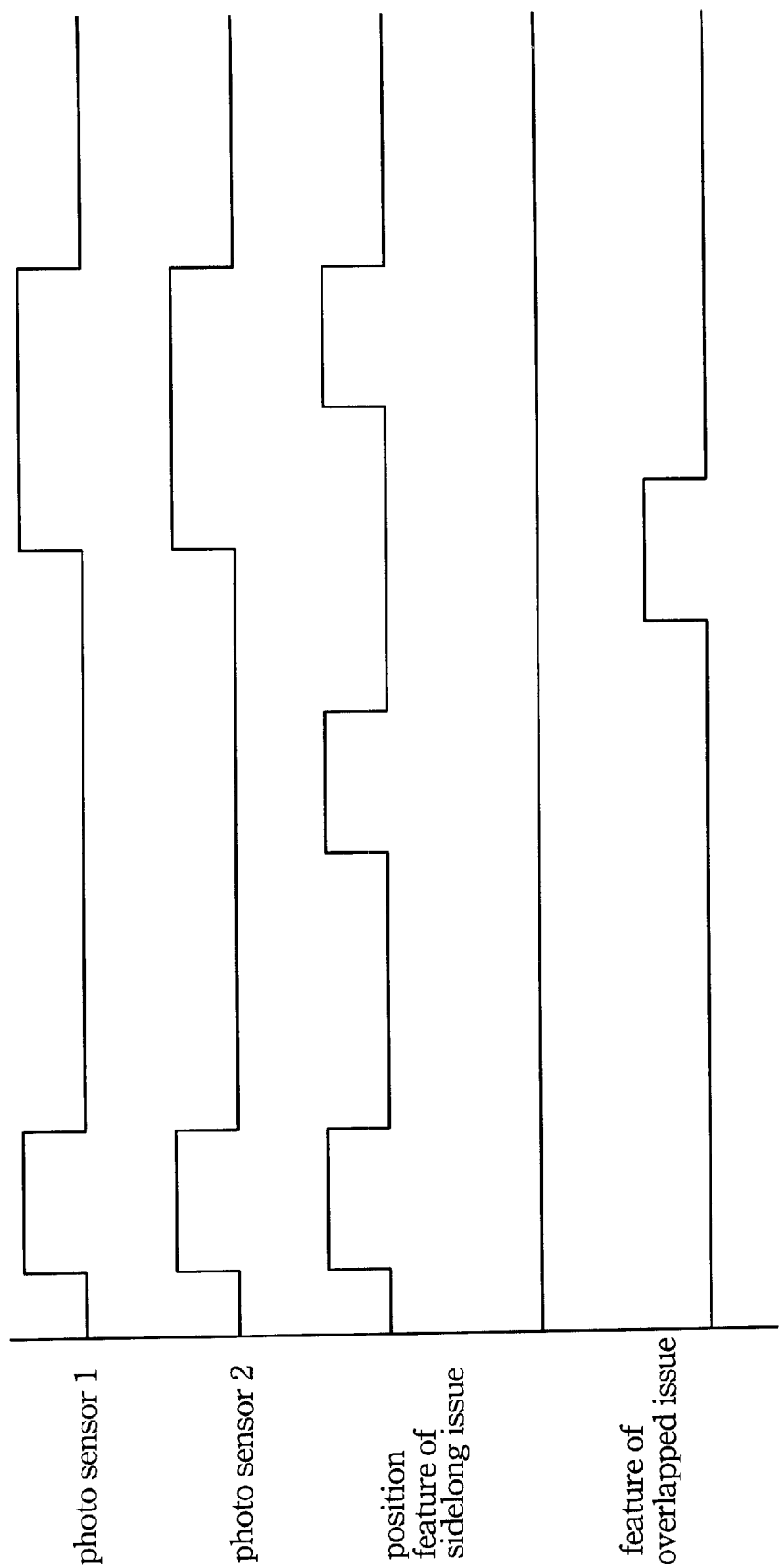
FIG. 11 is a time-based diagram of a situation having overlapped issue.

The detection of the overlapped issue:

When the overlapped issue occurs, the time-based diagram of three signals can also be obtained (see FIG. 11). Through the feature extraction process shown in FIG. 6, the feature signal of the overlapped issue can be acquired.

In FIG. 11, it is shown how the wafer in the second slot overlaps the one in the third slot as the result of misplacement. This figure further shows that, even though the pattern-based signal by position is fixed, there is an overlap between pulse signals of optical sensors 1 and 2 mapping the second and the third slots. In theory, when the overlapped issue happens, signals detected by optical sensors may not indicate an overlap, but possibly a small distance between wafers.

After processing two optical sensors' signals and patterned-based signals by position through implementing the feature extraction process in FIG. 6, the feature signal of the overlapped issue can be acquired. Afterwards, through the signal-converting circuit shown in FIG. 7, the value of the overlapped signal is 1, and that of the sidelong signal is 0.

The above feature extraction method can be done by using the hardware circuit, such as the circuit diagram in FIG. 6. Nevertheless, this invention is not limited by this extraction method. Computer software can also do the same job and reach the same goal.

Through converting signals, feature signals become digital ones which can be used by the digital data processor.

Even though the overlapped feature signal also occurs in FIG. 10, it obviously happens after that of the sidelong feature signal. In addition, this overlapped feature signal should not exist since detecting the sidelong issue is the main purpose, instead of the overlapped one. Thus, through FIG. 7 (the signal converting circuit plot), this overlapped signal can be filtered in order to obtain the real sidelong signal.

In summary, the advantage of the wafer-mapping method suggested by this invention is to detect the wafer position, sidelong and overlapped issues through employing the digital-signal method.

It is also the advantage of this invention to rapidly detect the wafer position, sidelong and overlapped issues at the same time.

Using two sensor and position signals in wafer mapping is another advantage of this invention.

Finally, this invention is beneficial in conducting the feature extract process through implementing electronic circuits or software programs.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A wafer mapping method of a wafer load port equipment, for mapping a plurality of wafers, the method comprising:

producing a pattern-based signal by position corresponding to a plurality of slots of a carrier, wherein the pattern-based signal by position is produced by a servomotor located on a mating plate of the wafer load port equipment;

using two optical sensors to produce an optical sensor type of signal; and conducting a feature extract process by using the pattern-based signal by position and the optical sensor type of signal, wherein the feature extract process further comprises using a feature extract circuit to separately produce a sidelong feature signal and an overlapped feature signal, the feature extract circuit comprising two XOR gates and one AND gate.

2. The wafer mapping method of the wafer load port equipment according to claim 1, wherein each slot has a corresponding pulse signal.

3. The wafer mapping method of the wafer load port equipment according to claim 1, wherein the two optical sensors are situated on the mating plate.

4. The wafer mapping method of the wafer load port equipment according to claim 1, wherein the two optical sensors are reflective-type.

5. The wafer mapping method of the wafer load port equipment according to claim 1, wherein the feature extract process further comprises using a signal converting circuit to separately converts the sidelong feature signal and the overlapped feature signal into a sidelong signal and an overlapped signal.

6. The wafer mapping method of the wafer load port equipment according to claim 5, wherein when there are pulses occurred in both the sidelong feature signal and the overlapped feature signal during the feature extract process, then a value of the sidelong signal is 1 and that of the overlapped signal is 0 to point out a sidelong issue by using the signal converting circuit.

7. The wafer mapping method of the wafer load port equipment according to claim 5, wherein an overlapped issue occurs when a value of the sidelong signal is 0, and when that of the overlapped signal is 1.

8. The wafer mapping method of the wafer load port equipment according to claim 1, wherein there is a wafer-lacking issue when a pulse of the pattern-based signal by position occurs, and when the two optical sensors have no corresponding pulse.

* * * * *